United States Statutory Invention Registration [19]

[11] Reg. Number: H609

Higgins et al. [43] Published: Mar. 7, 1989

[54] CCD TRANSVERSAL FILTER USING WEIGHTED INPUT

[75] Inventors: J. Aiden Higgins; Rajeshwar Sahai; Emilio A. Sovero, all of Thousand Oaks, Calif.

[73] Assignee: The United States of America as represented by the Secretary of the Air Force, Washington, D.C.

[21] Appl. No.: 819,962

[22] Filed: Jan. 21, 1986

[51] Int. Cl.[4] ..... G11C 19/28; H01L 29/78

[52] U.S. Cl. ..... 377/61; 357/24; 333/165

[58] Field of Search ..... 357/24; 377/57–63; 333/165

[56] References Cited

U.S. PATENT DOCUMENTS

| | | | |
|---|---|---|---|
| 4,034,199 | 7/1977 | Lampe et al. . | |
| 4,080,581 | 3/1978 | Sakaue et al. | 357/24 |
| 4,120,035 | 10/1978 | Cases et al. . | |
| 4,156,923 | 5/1979 | Lampe et al. . | |
| 4,163,957 | 8/1979 | Knauer et al. | 333/165 |
| 4,233,578 | 11/1980 | Knauer et al. | 357/24 |
| 4,243,958 | 1/1981 | Wilde . | |
| 4,245,199 | 1/1981 | Suciu . | |
| 4,264,983 | 4/1981 | Miller . | |
| 4,333,109 | 6/1982 | Ciciora . | |
| 4,336,613 | 6/1982 | Hewes . | |
| 4,443,774 | 4/1984 | Luder et al. | 333/165 |
| 4,503,432 | 3/1985 | Bailey . | |
| 4,612,521 | 9/1986 | Kleefstra et al. | 357/24 |

OTHER PUBLICATIONS

Baertsch, et al., The Design and Operation of Practical Charge-Transfer Transversal Filters, IEEE Transactions on Electron Devices, vol. ED-23, p. 133 (Feb. 1976).

Buss, et al., Communication Applications of CCD Transversal Filters, IEEE National Telecommunications Conference Record, vol. 1, p. 366 (Dec. 1-3, 1975).

Boyle, et al., Charge Coupled Semiconductor Devices, Bell System Technical Journal, vol. 49, p. 587 (Apr. 1970).

Brodersen, et al., A 500-Stage CCD Transversal Filter for Spectral Analysis, IEEE Transactions on Electron Devices, vol. ED-23, p. 143 (Feb. 1976).

Butler, et al., Charge-Transfer Analog Memories for Radar and ECM Systems, IEEE Transactions on Electron Devices, vol. ED-23, p. 161 (Feb. 1976).

Kosonocky, et al., The ABCs of CCDs, Electronic Design, vol. 23, p. 58 (Apr. 12, 1975).

White, et al., Charge Coupled Device (CCD) Analog Signal Processing, Proceedings of 1975 Naval Electronics Laboratory Center International Conference on the Application of Charge-Coupled Devices, p. 189 (Oct. 29-31, 1975).

*Primary Examiner*—Stephen C. Buczinski
*Assistant Examiner*—Linda J. Wallace
*Attorney, Agent, or Firm*—Donald J. Singer; Thomas L. Kundert

[57] ABSTRACT

An analog transversal filter includes a charge transfer delay line, including a plurality of cells for storing electrical charge, and a multiphase clock to transfer electrical charge from cell to cell through the delay line. A plurality of injection electrodes are connected to predetermined ones of the cells to sample an electrical signal, weight the signal sample a predetermined amount, and inject a charge packet representing the weighted signal sample into the cell. An output electrode collects and sums the charge packets transferred through the delay line. In another embodiment, the filter includes a plurality of charge transfer delay lines, with a plurality of cells for storing electrical charge in each delay line. A third embodiment includes a charge transfer delay line with a plurality of stages, each stage including a plurality of cells for storing electrical charge such that the cells of each stage are wider, in a direction transverse to the direction of charge transfer in the delay line, than the cells of preceding stages within the delay line. A plurality of end injection electrodes, each connected to one of the stages, and a plurality of side injection electrodes, each connected to a predetermined one of the cells, sample the signal, weight the signal sample a predetermined amount, and inject a charge packet representing the weighted signal sample into the stage or the cell, respectively.

7 Claims, 6 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CCD TRANSVERSAL FILTER USING WEIGHTED INPUT

GOVERNMENT RIGHTS

The Government has rights in this invention pursuant to a contract awarded by the Department of the Air Force.

BACKGROUND OF THE INVENTION

This invention concerns the field of charge coupled device (CCD) transversal filters.

Charge coupling is the collective transfer, by the external manipulation of voltages, of all the mobile electric charge stored within a semiconductor storage element to a similar, adjacent storage element. Majority carriers (or their absence) may be stored in a spatially defined depletion region (a potential well) at the surface of a homogeneous semiconductor. A potential well is a localized volume in the semiconductor substrate which, because it is the most positive location, is attractive to a negative electrons. Charge coupling is particularly useful in processing signal information because the amount of electrical charge which is contained in each charge packet can be used to represent information.

Packets of electrical charge move through a CCD as a result of a continuous lateral displacement of the local potential wells. A potential well is moved by applying a periodic waveform, called the clock voltage, to electrodes on the CCD. Under the influence of the clock voltage, some of the electrons in the vicinity of each electrode form a discrete packet of charge and move from one charge coupled element, or unit cell, to the next cell for each full clock cycle.

A CCD array is well suited as a time sample analog shift register, i.e., a delay line in which the time delay is proportional to the readin/readout rate. CCDs are inherently analog and thus can readily perform sampled data filtering functions in the analog domain. Furthermore, the analog nature of the CCD makes it possible to store more than one data bit in each memory cell and affords a CCD an inherently large dynamic range.

Any signal processing task involving the linear transformation of analog signals, such as correlation, discrete Fourier transforms, filter banks, matched filtering, multiplexing/demultiplexing, array scanning, orthogonal scan transformations, time base translations, etc., can be realized with CCDs. In sampled data filtering functions, for example, data is sampled at a certain frequency and the samples are operated on to produce a desired output. In this application, a CCD is advantageous over more conventional delay lines because of its wide dynamic range and because the propagation velocity and the delay time can be separately controlled. Sampled data filtering has typically been done in the prior art by fabricating a delay line with interim taps at which the signal is sensed and fed back to earlier stages to affect the transmission of the data. Such a structure can be conveniently configured as a bandpass filter where the resonant frequency of the circuit is a direct function of the clock frequency.

Analog-to-digital conversion is expensive and complicated when a large dynamic range (8 or more bits) is required in conjunction with a large bandwidth (5 MHz or more). By using a CCD, sampled data filtering can be performed in the analog domain, thereby eliminating the need for an analog-to-digital conversion and simplifying the associated electronics. The control of the CCD by a master clock also permits a high degree of synchronization and stability. Furthermore, the time delays involved are insensitive to temperature and component drift. All these factors support the choice of an analog CCD implementation over digital approaches to signal processing.

In a serial in/parallel out filtering function, independent, nondestructive low impedance voltage readouts of analog signals are accomplished at specified locations or taps along the CCD, corresponding to various delays through the CCD shift register. The signal voltage which is measured at each tap may be multiplicatively weighted by conductance to give a current proportional to the product of the signal voltage and the weighting conductance. The summation of these product currents can then provide such functions as transversal filtering, correlation, or sampled data smoothing. A two dimensional weighting matrix driven by independent low impedance taps can be used for discrete Fourier transformers, filter banks, or multiple cross correlators. Electrically reprogrammable analog weights combined with these building blocks can be used in adaptive filtering for communications applications. The use of programmable conductances, such as with nonvolatile MNOS or conventional MOS devices, permits such applications as an adaptive transversal line equalizer or a programmable matched filter. Such matched filters are used in wide spectrum communications systems and in radar to detect weak signals in high noise backgrounds.

In such a transversal CCD filter, each delay stage in the CCD represents one clock period of CCD delay. The input signal is nondestructively sampled at each stage, multiplied by weighting coefficients, and the products are summed. The resulting output is in the form of a sampled data convolution of the input signal with the filter coefficients.

The transversal CCD filters which are known in the art have typically been implemented with a split electrode, which is either a driven electrode or a floating electrode extending across the width of the CCD. A split electrode provides weighting by dividing up the current due to charge passing beneath the electrode. The split electrode technique, however, has been implemented in silicon technology and at frequencies much lower than 25 MHz. With the advent of faster semiconductor technologies, such as III–V GaAs devices, a need has developed for a new transversal filter CCD architecture which will operate with improved accuracy and additional immunity to noise.

SUMMARY OF THE INVENTION

In one embodiment, the analog transversal filter of this invention includes a charge transfer delay line, including a plurality of cells for storing electrical charge, and a multiphase clock to transfer electrical charge from cell to cell through the delay line. A plurality of injection electrodes are connected to predetermined ones of the cells to sample an electrical signal, weight the signal sample a predetermined amount, and inject a charge packet representing the weighted signal sample into the cell. An output electrode collects and sums the charge packets transferred through the delay line.

In another embodiment, the filter includes a plurality of charge transfer delay lines, with a plurality of cells for storing electrical charge in each delay line and a multiphase clock for transferring electrical charge from cell to cell through each delay line. A plurality of injection electrodes is each connected to one of the delay lines to sample the signal, weight the signal sample a predetermined amount, and inject a charge packet representing the weighted signal sample into the delay line. An output electrode collects and sums the charge packets transferred through the delay lines.

A third embodiment includes a charge transfer delay line with a plurality of stages, each stage including a plurality of cells for storing electrical charge such that the cells of each stage are wider, in a direction transverse to the direction of charge transfer in the delay line, than the cells of preceding stages within the delay line. A multiphase clock transfers electrical charge from cell to cell through the delay line. A plurality of end injection electrodes, each connected to one of the stages, and a plurality of side injection electrodes, each connected to a predetermined one of the cells, sample the signal, weight the signal sample a predetermined amount, and inject a charge packet representing the weighted signal sample into the stage or the cell, respectively. An output electrode collects and sums the charge packets transferred through the delay line.

BRIEF DESCRIPTION OF THE DRAWINGS

Additional details of the invention are presented below in the descriptive section, which refers to the drawings, where.

DESCRIPTION OF THE INVENTION

Figure 1:
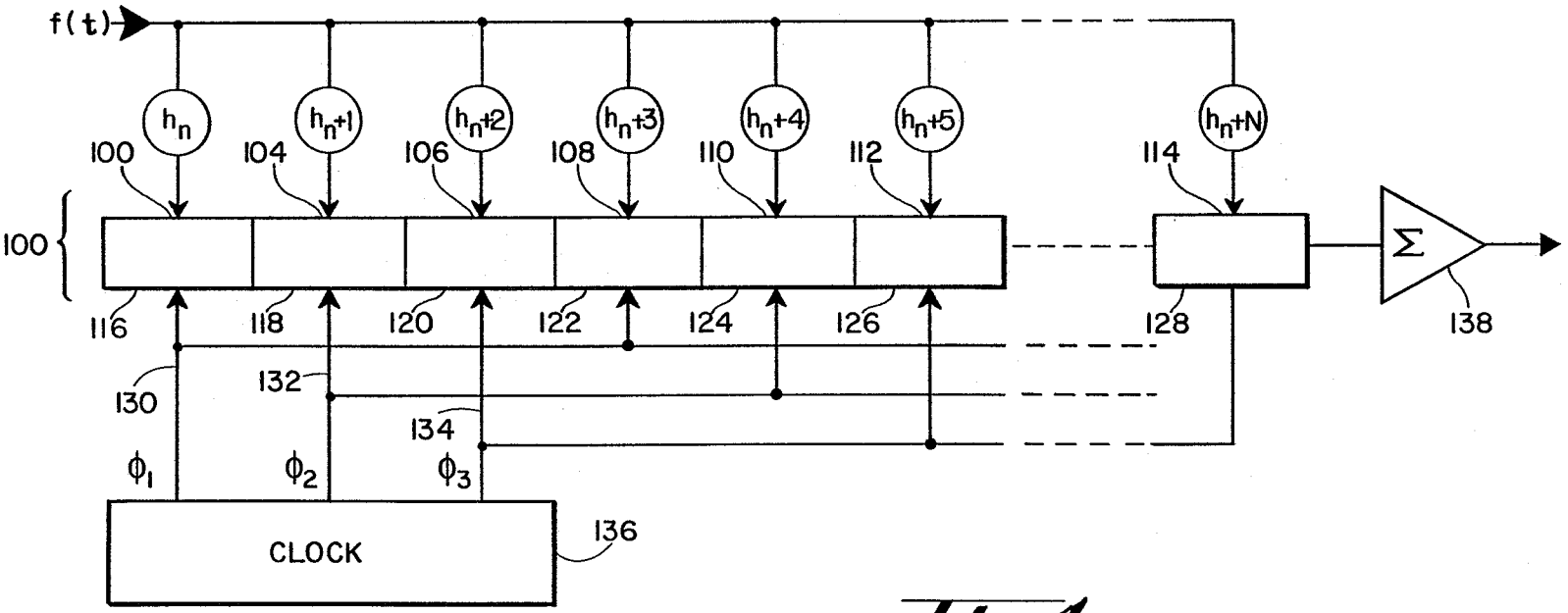
FIG. 1 is a schematic diagram illustrating the operation of the CCD transversal of this invention.

FIG. 1 is a schematic diagram illustrating the novel manner in which the CCD transversal filter of this invention operates. The technique is implemented with a charge sampling electrode at each input point in the delay line of the filter. Charge sampling is accomplished at the input points 102, 104, 106, 108, 110, 112 . . . 114 for cells 116, 118, 120, 122, 124, 126 . . . 128 of a CCD delay line 100. The input signal f(t) is subjected to a weighting function, whose coefficients for the cells 116–128 are represented by $h_n \ldots h_{n+N}$. After the weighting is applied to the signal, the weighted signal is injected into the CCD at the input points 102–114. This arrangement contravenes prior art techniques in which sampling is achieved by first tapping the delay line at multiple output points and then applying weighting to these outputs. Thus the CCD channel itself, contrary to prior art approaches, accomplishes the summing of the weighted charge signals. The weighted signal portions are clocked through the delay line by the phases 130, 132, and 134 of a multiphase clock 136. The final summation $$\sum_n h(n)f(t - nT)$$

(where h(n) is the weighting function and T is the sampling period) of this filtering function is achieved at the output node 138 of the CCD 100.

The CCD transversal filter of this invention has been used in one embodiment to implement a Finite Impulse Response (FIR) transversal half-band filter. This filter chip helps to integrate the three functions of communications, navigation, and identification into a single piece of equipment. The filter acts as a frequency selection device which can be rapidly changed to select different frequencies in the VHF band, so that time division multiplexing may be used to obtain all three functions. In one implementation, the CCD filter chip is part of an agile bandpass filter for signals in the VHF band (30 to 400 MHz) of fairly moderate strength. The filter stage will accept signals over a broad bandwidth, determined by the sampling and clocking frequency of the CCD devices, and it will select which half of the input bandwidth is allowed to pass through to the output port.

The design of the half-band sections calls for an impulse response for either the low or high pass frequencies. An outstanding feature of this half-band filter is that the magnitudes of the tap weights are constant and match exactly for the respective delays in both types. Thus only the signs of the side taps in the real or in-phase signal paths need be changed to select a different output response.

Tap weight values are calculated using the basic Sin(x)/x function corresponding to the selected value of bandwidth, with the necessary bit length of the transversal filter determined by the transition frequency bandwidth. The tap weight values are obtained by multiplying these quantities by a McClellan algorithm window function (See McClellan, et al., A Computer Program for Designing Optimum FIR Linear Phase Digital Filters, IEEE Transactions on Audio and Electroacoustics, Volume AU-21 (December 1973)). The added detail necessary to distinguish the low pass from the high pass and the real from the quadrature path is provided by the complex multiplier for each of the upper and lower band configurations. The lower band configuration is basically a bandpass configuration, but with a very low center frequency (sampling frequency divided by 8).

A low pass filter can be changed to a high pass filter with the same cutoff frequency simply by using the complement of the input signal. Convolution is achieved by summing the weighted, time-delayed versions of the signal. The maximum attenuation must be maintained by having accurate weighting coefficients. For proper operation, a FIR transversal (half-band) filter requires weighted sampling of the input signal at fixed delay intervals, plus accurate summing of those samples.

All the functions required in an n samples FIR filter can be implemented with n CCDs. The required sampling is obtained by using the CCDs to convert the input signal into charge packets, while the area of the input gate for each CCD determines the relative weight of each sample. The various required delays are obtained by routing the input signal through CCDs having different numbers of cells, with each CCD cell providing one clock period of delay. The charge transferred through all the CCDs in the filter is brought together at a single output node, where the total amount of charge is converted back into a voltage signal. Since the charge packets arriving at the output nodes of the CCDs have each undergone different time delays, the output voltage is effectively a sum of weighted time domain samples.

Figure 2:
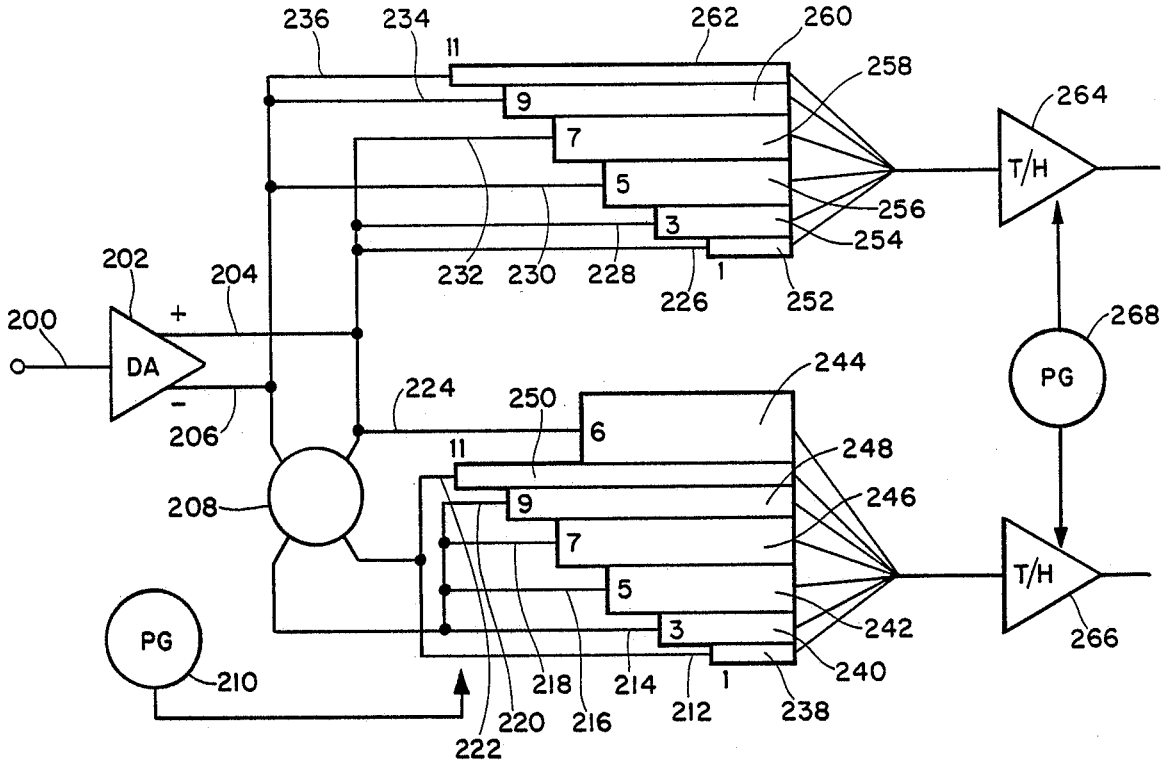
FIG. 2 schematically depicts a monolithic implementation of a half banding filter constructed according to this invention.

FIG. 2 depicts a monolithic implementation of a half banding filter with all the support circuitry included. There are two CCD devices, each in a "pipe organ" configuration. One set of CCDs is for the real path, while the other is for the quadrature path. In addition, the necessary support circuitry is included to output a nonsampled signal.

In operation the input signal is applied on an input line 200 to a balanced amplifier 202, which generates complementary signals 204 and 206. Complementary signals must be used to satisfy the requirement for positive (the signal 204) and negative (the signal 206) tap weights in the filter. When this technique is used with very small signals, the CCDs are quiescently biased to have a half full-charge propagating in the device at all times. The signals 204 and 206 are routed to the proper input gates of the CCDs through a MESFET switch 208, which is used to select the desired band and provides the programmability of the filter. A pulse generator circuit 210 produces subnanosecond pulses for input sampling control. The pulses from the circuit 210 are used to create samples at the input of each CCD.

In the particular embodiment shown here, there are seven real inputs 212–224 and six imaginary inputs 226–236. The real group includes the seven CCDs 238–250 and the imaginary or quadrature group includes the six CCDs 252–262. These two CCD groups provide the building blocks for a complex transversal filter. The imaginary group is connected to exhibit a band pass response, while the real CCD group is switchable (by means of the MESFET switch 208) between functioning as a low pass filter and as a high pass filter.

Since this particular embodiment of the inventive filter requires only seven tapping points, it is a relatively simple example of a transversal filter. The pipe organ approach is appropriate where only a few separate CCDs are used. The pipe organ combination of the seven CCDs 238–250 which constitutes the real (in phase) path transversal filter performs delay, weighting, and summation tasks for each of the seven taps. Weighting is accomplished through determining the amount of charge that could be formed (relatively) in the CCD with the appropriate delay. Summation is achieved by dumping all the charge into one capacitive node. The CCD outputs are monitored by two track and hold circuits 264 and 266, with a second pulse generator circuit 268 providing track and hold control. The pulses from the circuit 268 trigger the track-and-hold circuits to reconstruct the input signal while removing sampling and clocking feedthrough.

Figure 3A:
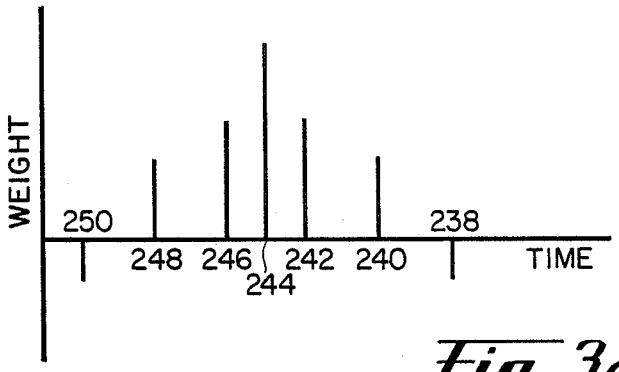
FIG. 3(*a*)–3(*c*) are a graphical depiction of the three filtering functions for which the filter of FIG. 2 can be configured.
Figure 3B:
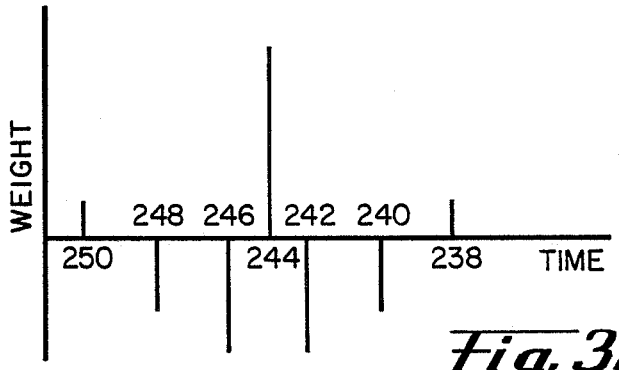
Figure 3C:
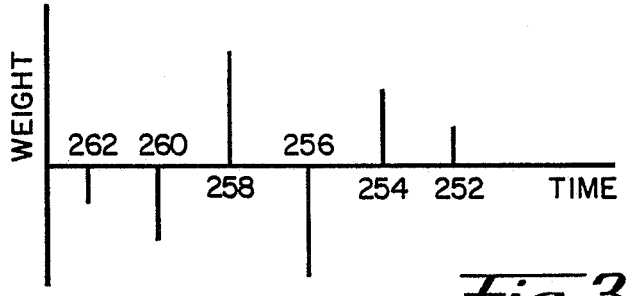

FIG. 3 is a graphical depiction of the three filtering functions for which the filter of FIG. 2 can be configured. The horizontal axis in each plot represents the relative time delay for each injection of a signal sample into a CCD, while the numbers associated with that axis indicate the CCD of FIG. 2 into which the sample is injected for each time delay. The vertical axis represents the relative weighting (positive or negative) which is applied to each injected signal sample. FIG. 3*a* depicts the weighted sampling scheme which will configure the real CCD group 238–250 to operate as a low-pass filter, while FIG. 3*b* depicts the sampling scheme for the high-pass configuration of the real CCD group. FIG. 3*c* similarly indicates the weighted sampling which is applied by the quadrature CCD group 252–262 to achieve band-pass filtering.

Figure 4:
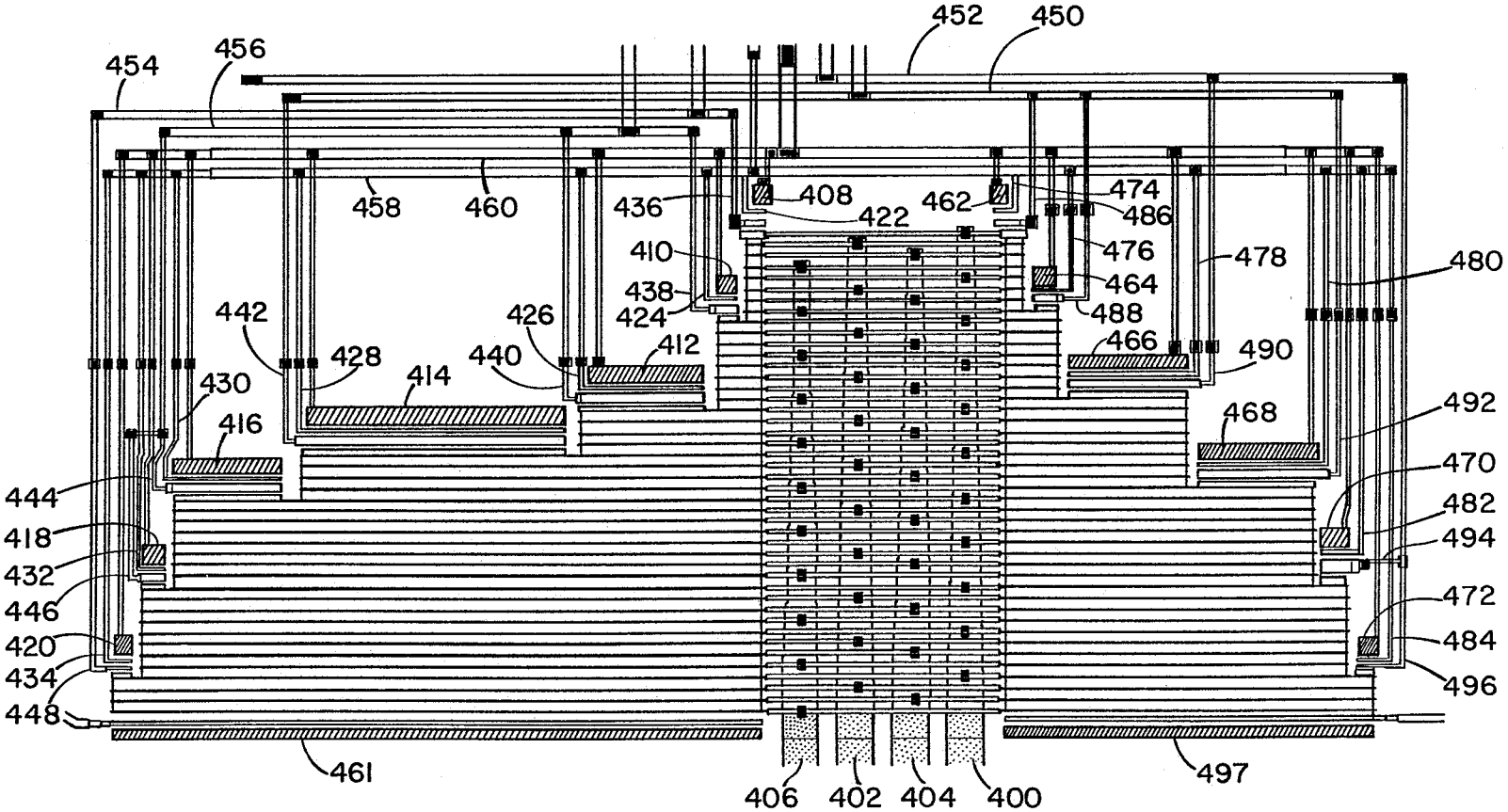
FIG. 4 is a plan view of a semiconductor mask layout for the half-band filter of FIG. 2, implemented with end injection signal sampling.

FIG. 4 is a plan view of a mask layout for the half-band filter of FIG. 2, implemented with end injection signal sampling. Clock signals for phases 1, 2, 3, and 4 of the CCD are provided on lines 400, 402, 404, and 406, respectively. Each gate of the CCD is provided with three lines to perform the input function. The input sampling pulses are applied, for the real half of the filter, to the lines 408, 410, 412, 414, 416, 418, and 420. The reference (the input transfer gate) is applied to lines 422, 424, 426, 428, 430, 432, and 434.

The signal to be filtered, referenced to the transfer gate, is applied to the appropriate cell of the CCD by the input lines 436, 438, 440, 442, 444, 446, and 448. Those input lines which are always positively weighted, such as the input line 442, are supplied by the constant positive line 450. Similarly, the input lines which are always negatively weighted are connected to the constant negative line 452. As can be seen from FIGS. 3*a* and 3*b*, however, none of the input lines for the real side of the filter are kept negative for both the low-pass and high-pass configurations, so none of these lines are connected to the line 452. Some of the input lines must be weighted either negatively or positively, depending upon whether the real side of the filter is configured as a high or low pass filter. These input lines (lines 436, 438, 440, 444, 446, and 448) are connected to supply line 454 or supply line 456, which are switched between positive and negative bias as required by the high or low pass configuration. The reference voltage level is supplied to lines 422–434 by line 458. Line 460 provides the input sample signal for all the gates. An output electrode 461 is provided for collecting the charge transferred through the real side CCDs.

Similar connections are provided for the CCDs in the imaginary side of the filter. Thus lines 462–472 are used to apply the input sampling pulses to the imaginary half of the filter, the reference is applied to lines 474–484, and the signal is applied through lines 486–496. An output electrode 497 collects the charge transferred through the CCDs in the imaginary side of the filter.

The magnitude of the weighting applied to each signal is determined by the size (active area) of the input gate for each signal sample, while the time delay of the injected sample is determined by the position in the CCD of the cell at which that signal is injected. The length (number of cells) of each CCD determines the amount of delay—the longer the CCD, the more delay.

Figure 5:
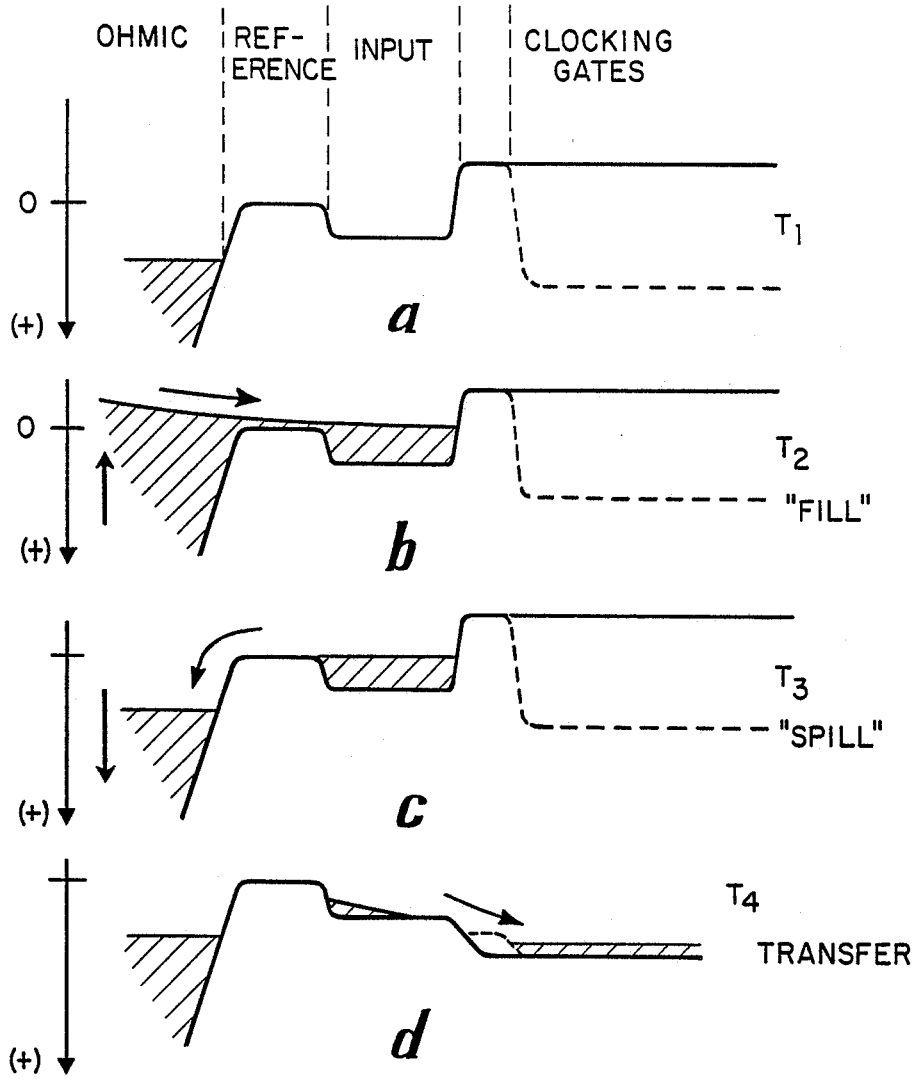
FIG. 5 is a potential diagram illustrating the operation of an input sampling scheme for the filter of FIG. 2.

FIG. 5 is a potential diagram illustrating the operation, at times $T_1$–$T_4$, of an input sampling scheme. This sampling scheme may be used in the filters of this invention to inject weighted signal samples into a CCD. The sampling pulse is applied to the ohmic electrode while the input signal (relative to the reference gate) is applied to the input gate. Next to the input gate are the clocking gates (with the exception of the side injection implementation of input sampling, as discussed below with respect to FIG. 6, when an additional dump gate is introduced). FIG. 5*a* depicts the potential diagram of the CCD input section at an instant ($T_1$) when the signal is not getting sampled. Upon the application of a sampling pulse, as in FIG. 5*b*, the potential of the ohmic region of the CCD, which acts as the source of signal electrons, changes as indicated by the arrows. The shaded area represents the presence of charge (electrons). FIG. 5*b* shows the "fill" action which occurs when the region under the input gate is filled by an inflow of electrons from the ohmic region. The next action in this input sampling process is the "spill", as shown in FIG. 5*c*. As the sampling pulse is removed (at a time $T_3$), any excess charge under the input gate spills back into the ohmic region over the reference gate potential. This "fill and spill" input sampling scheme thus meters an accurate amount of charge to form the signal charge packet under the input gate. This charge packet is linearly proportional to the signal potential (relative to the reference gate potential). Once the signal charge packet has been created, it is transferred under the clocking gates either directly or through a dump gate, as shown by the dotted lines in FIG. 5*d*.

Figure 6:
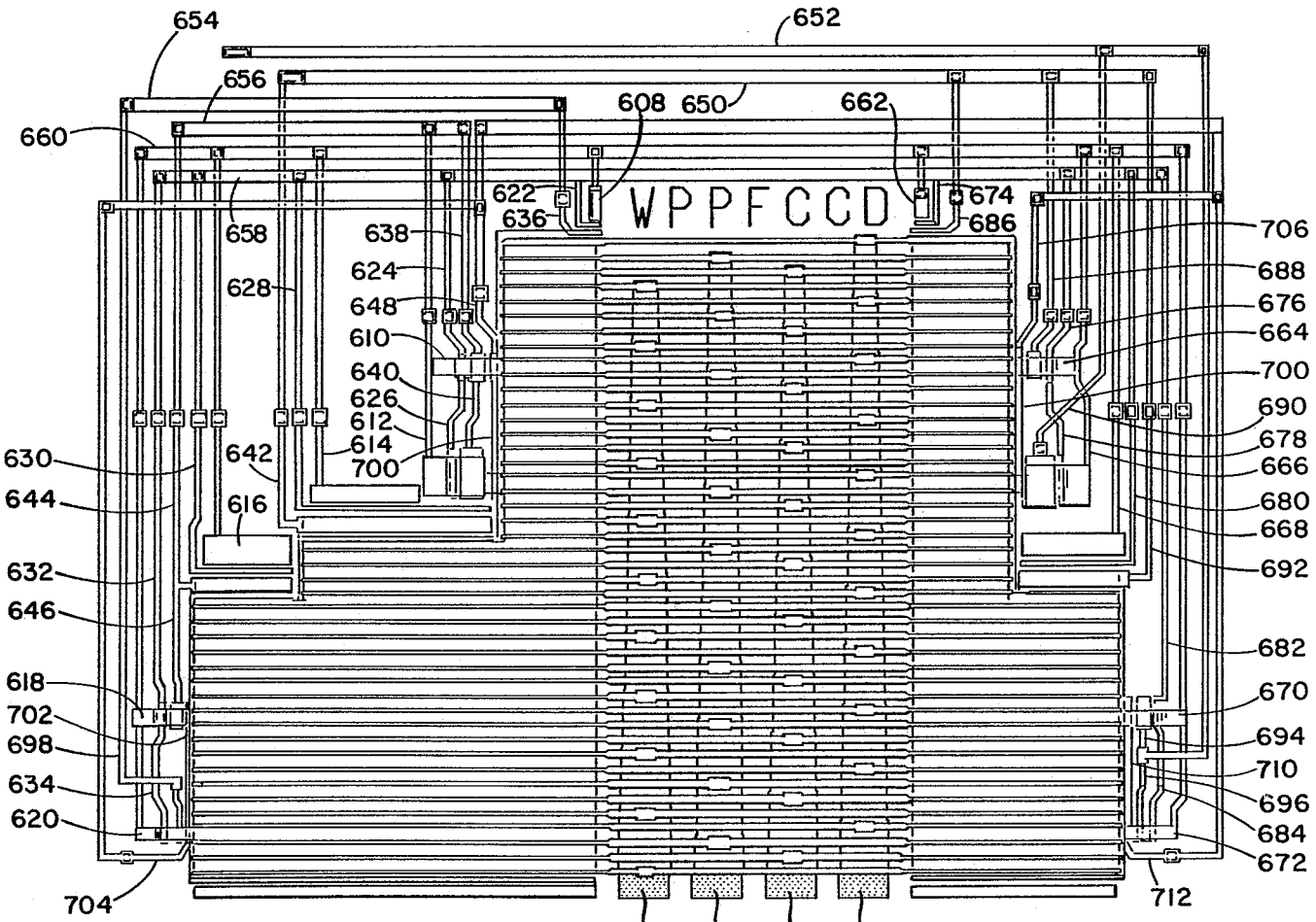
FIG. 6 is a plan view of an alternative mask layout for the filter of FIG. 2.

FIG. 6 is a plan view of an alternative mask layout for the half-band filter of FIG. 2. This layout is similar to that of FIG. 4, so that the clock lines 600–606, the real input lines 608–620, the real reference lines 622–634, the real signal lines 636–648, the supply lines 650–656, the reference voltage line 658, the input sample line 660, the imaginary input lines 662–672, the imaginary reference lines 674–684, and the imaginary signal lines 686–696 are all similar to the analogous elements in the filter of FIG. 4. In the embodiment of FIG. 6, however, the filtering is implemented with a combination of end injection signal sampling and side injection sampling. This approach requires additional dump (side transfer) gates 698–712 to be provided for each side injection input site in the filter. Side injection is used for those inputs where the weighting factor is small enough to allow accommodation of the input gates within the location for phases 2 and 3 of the clock cycle. The multiple CCD layout is provided in this embodiment so that end injection inputs can be used for the larger weighted signals. With a larger CCD, however, a larger number of signal inputs, each with smaller weights, could be included and thus side injection could be employed for all of the signal inputs. The charge transfer efficiency, however, which is reduced for each extra stage in the CCD, imposes an upper limit on this approach.

In conclusion, the filter of this inventions provides significant advantages over the prior art techniques. In the present invention, for example, any error in the injection of a particular weighted signal will not affect any other weighted injection, whereas in a prior art tapped filter, any error affects all the outputs which are tapped further down the CCD. It has been shown that filters fabricated according to this invention can operate at clock rates in excess of 1 GHz with a charge transfer efficiency of over 0.9999. The preferred embodiments of the invention have been illustrated and discussed, but modifications and additional embodiments will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the examples presented are not all inclusive, but are intended to teach those skilled in the art how to make and use the invention, while the appended claims are more indicative of the full scope of the invention.

We claim:

1. An analog transversal filter for processing an electrical signal, comprising:

a charge transfer delay line, including a plurality of cells for storing electrical charge;

a multiphase clock for transferring electrical charge from cell to cell through the delay line;

a plurality of injection electrodes, each electrode being connected to a predetermined one of the cells to sample the signal, weight the signal sample a predetermined amount, and inject a charge packet representing the weighted signal sample into the cell; and an output electrode for collecting and summing the charge packets transferred through the delay line.

2. The filter of claim 1, wherein the weight applied to the signal sample by each injection electrode is directly proportional to the size of that electrode.

3. An analog transversal filter for processing an electrical signal, comprising:

a plurality of charge transfer delay lines, each delay line including a plurality of cells for storing electrical charge;

a multiphase clock for transferring electrical charge from cell to cell through each delay line;

a plurality of injection electrodes, each electrode being connected to one of the delay lines to sample the signal, weight the signal sample a predetermined amount, and inject a charge packet representing the weighted signal sample into the delay line; and an output electrode for collecting and summing the charge packets transferred through the delay lines.

4. The filter of claim 3, wherein the weight applied to the signal sample by each injection electrode is directly proportional to the size of that electrode.

5. An analog transversal filter for processing an electrical signal, comprising:

a charge transfer delay line, including a plurality of stages, each stage including a plurality of cells for storing electrical charge such that the cells of each stage are wider, in a direction transverse to the direction of charge transfer in the delay line, than the cells of preceding stages within the delay line;

a multiphase clock for transferring electrical charge from cell to cell through the delay line;

a plurality of injection electrodes, each electrode being connected to one of the stages to sample the signal, weight the signal sample a predetermined amount, and inject a charge packet representing the weighted signal sample into the stage; and an output electrode for collecting and summing the charge packets transferred through the delay line.

6. A method of processing an electrical signal through a charge transfer delay line including a plurality of cells for storing electrical charge, comprising the steps of:

sampling the signal at a predetermined rate;

weighting the signal according to a predetermined weighting function;

injecting a charge packet representing the weighted signal sample into one of the cells;

repeating the steps of weighting and injecting for a predetermined plurality of the cells;

applying the outputs of a multiphase clock to the cells to transfer the charge packets through the delay line; and collecting the summing the charge packets transferred through the delay line.

7. A method of processing an electrical signal through a plurality of charge transfer delay lines each having a plurality of cells for storing electrical charge, comprising the steps of:

sampling the signal at a predetermined rate;

weighting the signal according to a predetermined weighting function;

injecting a charge packet representing the weighted signal sample into one of the delay lines;

repeating the steps of weighting and injecting for each delay line;

applying the outputs of a multiphase clock to the cells in each delay line to transfer the charge packets through the delay lines; and collecting and summing the charge packets transferred through the delay lines.

* * * * *